United States Patent
Shi et al.

(10) Patent No.: US 7,794,242 B2
(45) Date of Patent: Sep. 14, 2010

(54) CONDUCTIVE ELASTIC SHEET STRUCTURE AND ELECTRONIC DEVICE USING THE SAME

(75) Inventors: Zheng Shi, Shenzhen (CN); Chih-Chiang Chang, Taipei Hsien (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 25 days.

(21) Appl. No.: 12/333,433

(22) Filed: Dec. 12, 2008

(65) Prior Publication Data

US 2009/0247021 A1 Oct. 1, 2009

(30) Foreign Application Priority Data

Mar. 26, 2008 (CN) .......................... 200810300713

(51) Int. Cl.
*H01R 4/66* (2006.01)
(52) U.S. Cl. ...................................................... 439/92
(58) Field of Classification Search .................. 439/92, 439/66, 856, 95, 326
See application file for complete search history.

(56) References Cited

U.S. PATENT DOCUMENTS

| 6,004,169 | A | * | 12/1999 | Wu ............................. 439/856 |
| 7,241,159 | B1 | * | 7/2007 | Chen et al. ................... 439/326 |
| 7,371,084 | B2 | * | 5/2008 | Xue et al. ...................... 439/95 |
| 7,470,151 | B2 | * | 12/2008 | Yamaguchi et al. ......... 439/658 |
| 2002/0039849 | A1 | * | 4/2002 | Villain et al. .................. 439/92 |
| 2004/0011636 | A1 | * | 1/2004 | Sasaki et al. ................. 200/553 |
| 2004/0132319 | A1 | * | 7/2004 | Richter et al. ................. 439/66 |
| 2006/0040530 | A1 | * | 2/2006 | Miyamoto .................... 439/95 |

* cited by examiner

*Primary Examiner*—Jean F Duverne
(74) *Attorney, Agent, or Firm*—Steven M. Reiss

(57) ABSTRACT

The invention discloses a conductive elastic sheet structure mounted on a metallic cover of an electronic device eliminates static electricity. The conductive elastic sheet structure includes a main panel, a first extending portion, and a second extending portion. The main panel includes a first side wall, and a second side wall opposite to the first side wall. The first extending portion and the second extending portion extend from the side edges of the first side wall and the second side wall respectively, and each forms a sharp angle with the main panel. The first extending portion and the second extending portion extend from two opposite sides of the main panel respectively. The invention also provides an electronic device using the conductive elastic sheet structure.

13 Claims, 10 Drawing Sheets

CONDUCTIVE ELASTIC SHEET STRUCTURE AND ELECTRONIC DEVICE USING THE SAME

BACKGROUND

1. Technical Field

The present invention relates to a conductive elastic sheet structure and an electronic device using the conductive elastic sheet structure.

2. Discussion of the Related Art

With the development of wireless communication and information processing technology, portable electronic devices such as mobile phones and personal digital assistants (PDAs) are now in widespread use. Consumers may enjoy the full convenience of the portable electronic devices almost anytime and anywhere.

With the wide usage of metallic materials, more and more portable electronic devices are beginning to having metallic covers instead of plastic covers. However, metallic covers easily generate static electricity. Accordingly, the portable electronic devices need a grounding structure to eliminate the static electricity of the metallic covers. A typical grounding structure uses an elastic sheet adhered to the metallic cover. The elastic sheet physically attaches to a grounding point and thus can conduct the static electricity away. However, the elastic sheet tends to detach from the metallic cover overtime after repeatedly usage.

Therefore, there is a room for improvement within the art.

BRIEF DESCRIPTION OF THE DRAWING

Many aspects of the present conductive elastic sheet structure can be better understood with reference to the drawing. The components in the drawings are not necessarily drawn to scale, the emphasis instead being placed upon clearly illustrating the principles of the present conductive elastic sheet structure.

DETAILED DESCRIPTION OF THE EMBODIMENT

Figure 1:
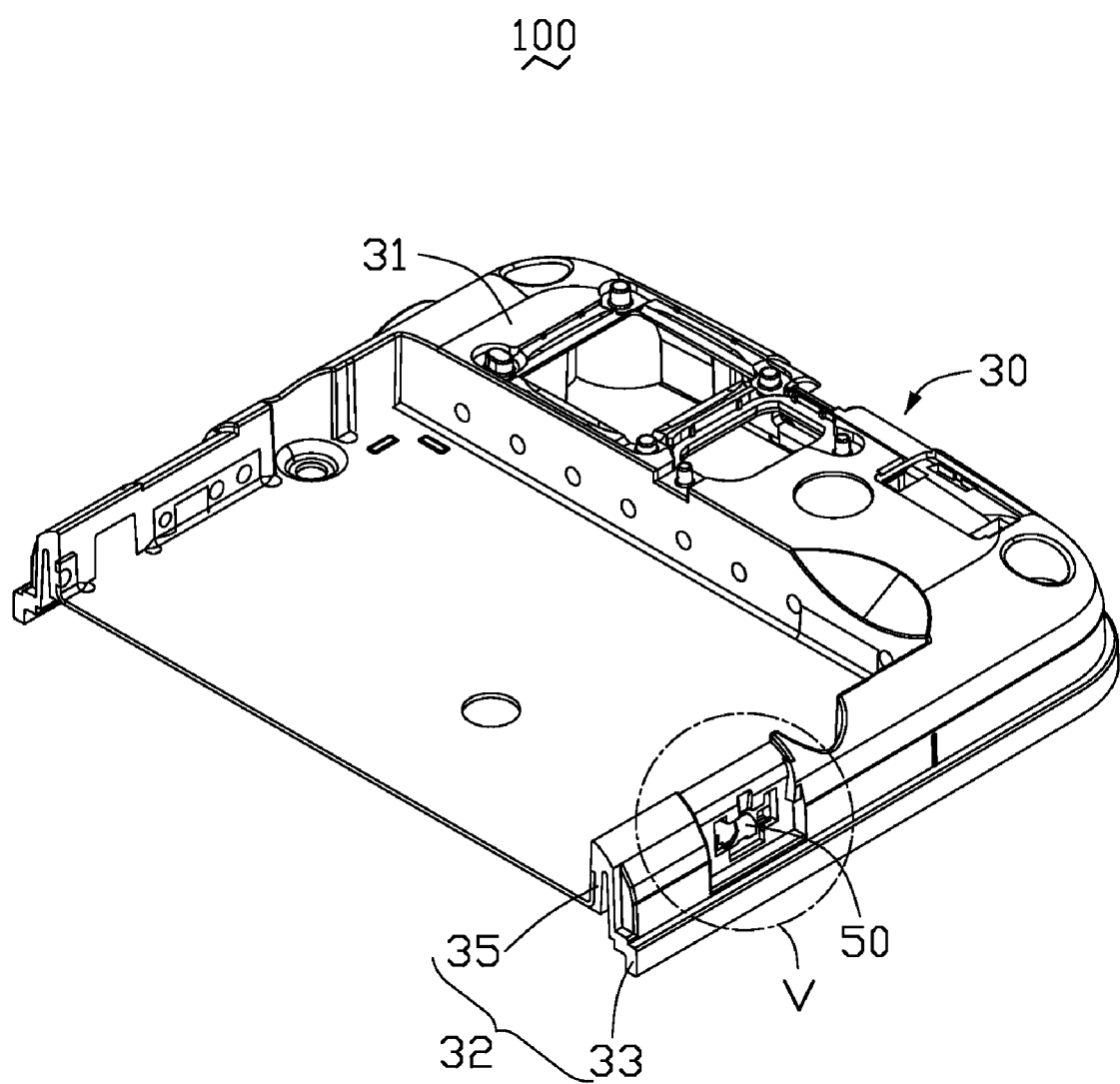
FIG. 1 shows a partially, perspective view of a conductive elastic sheet structure assembled to a metallic cover of an electronic device.
Figure 2:
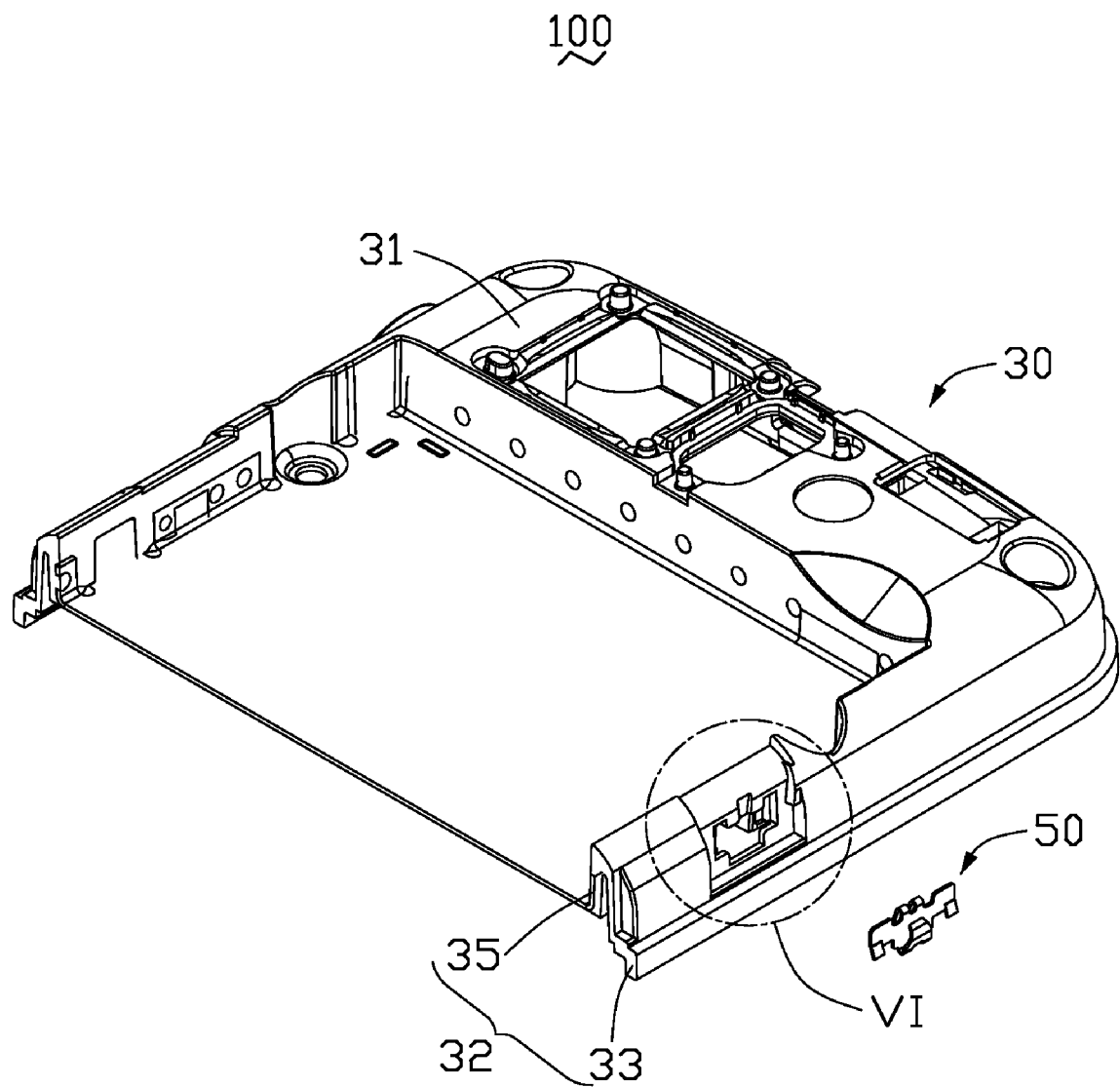
FIG. 2 shows a disassembled view relative to FIG. 1.
Figure 3:
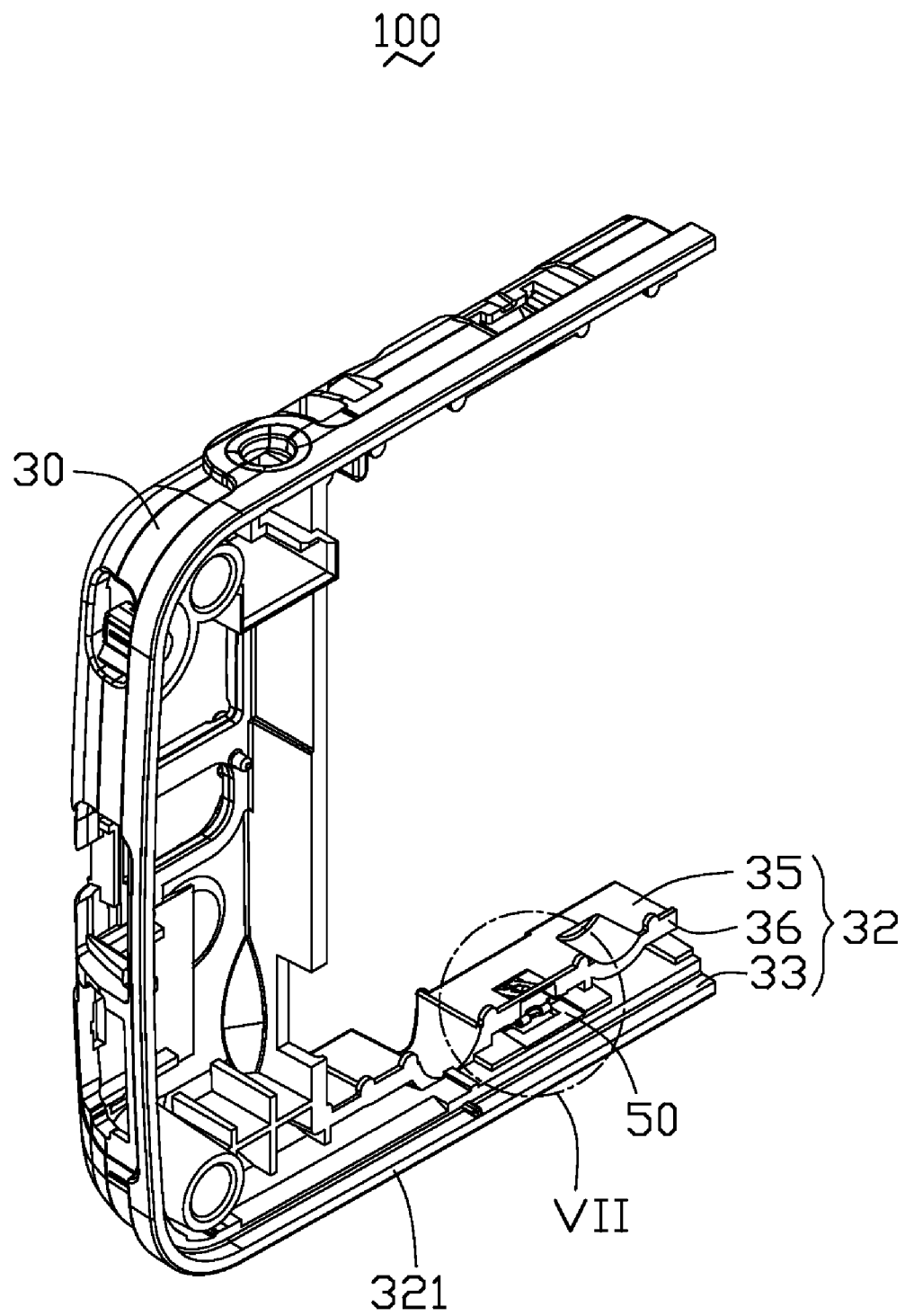
FIG. 3 is similar to FIG. 1, but showing another aspect.

Referring to FIGS. 1, 2 and 3, the electronic device 100 includes a metallic cover 30 and a conductive elastic sheet structure 50. The metallic cover 30 includes an upper wall 31 and a side wall 32 connecting two opposite edges of the upper wall 31. The side wall 32 includes an outer portion 33, an inner portion 35 and a connecting wall portion 36 between the outer portion 33 and the inner portion 35.

Figure 4:
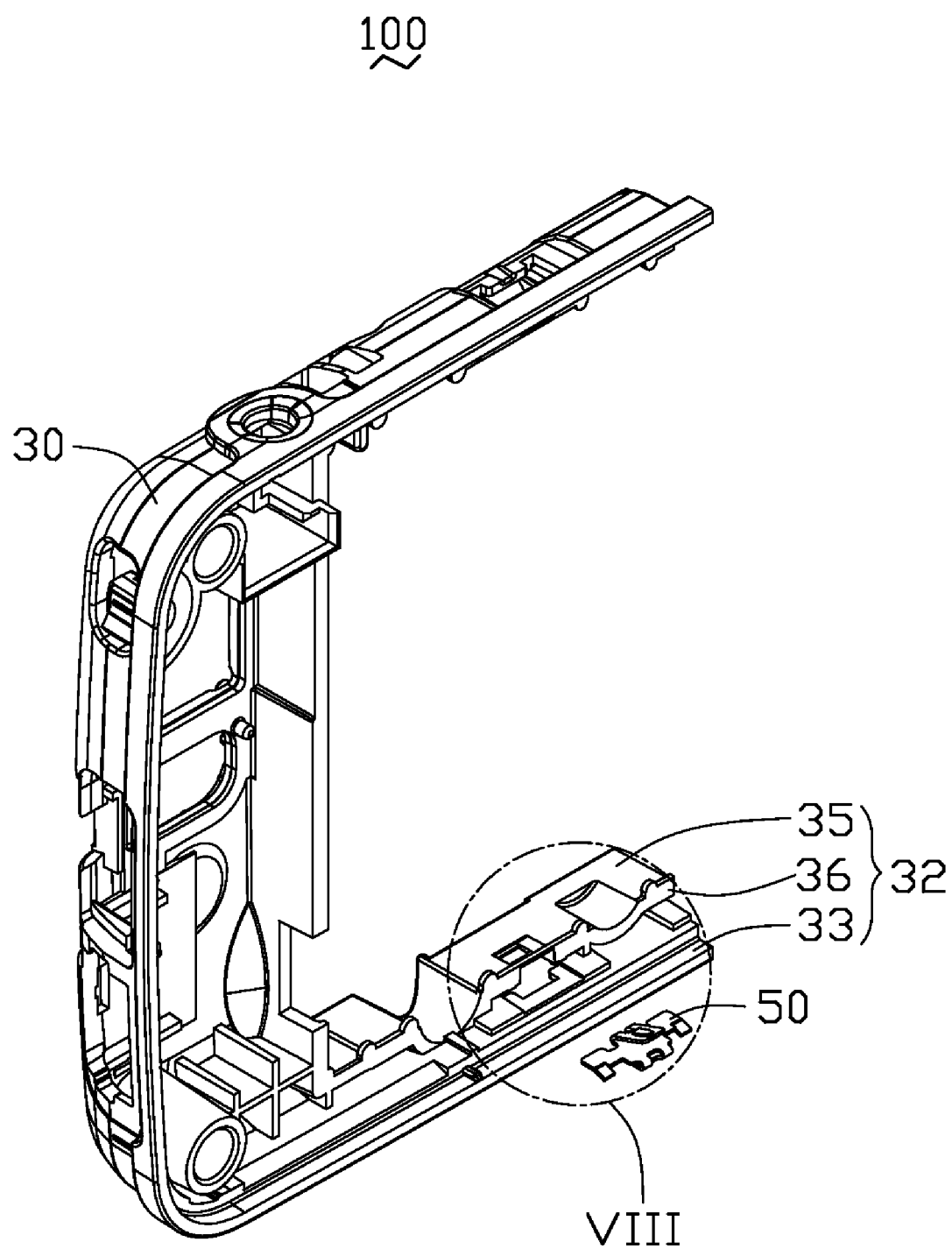
FIG. 4 is similar to FIG. 2, but showing another aspect.
Figure 5:
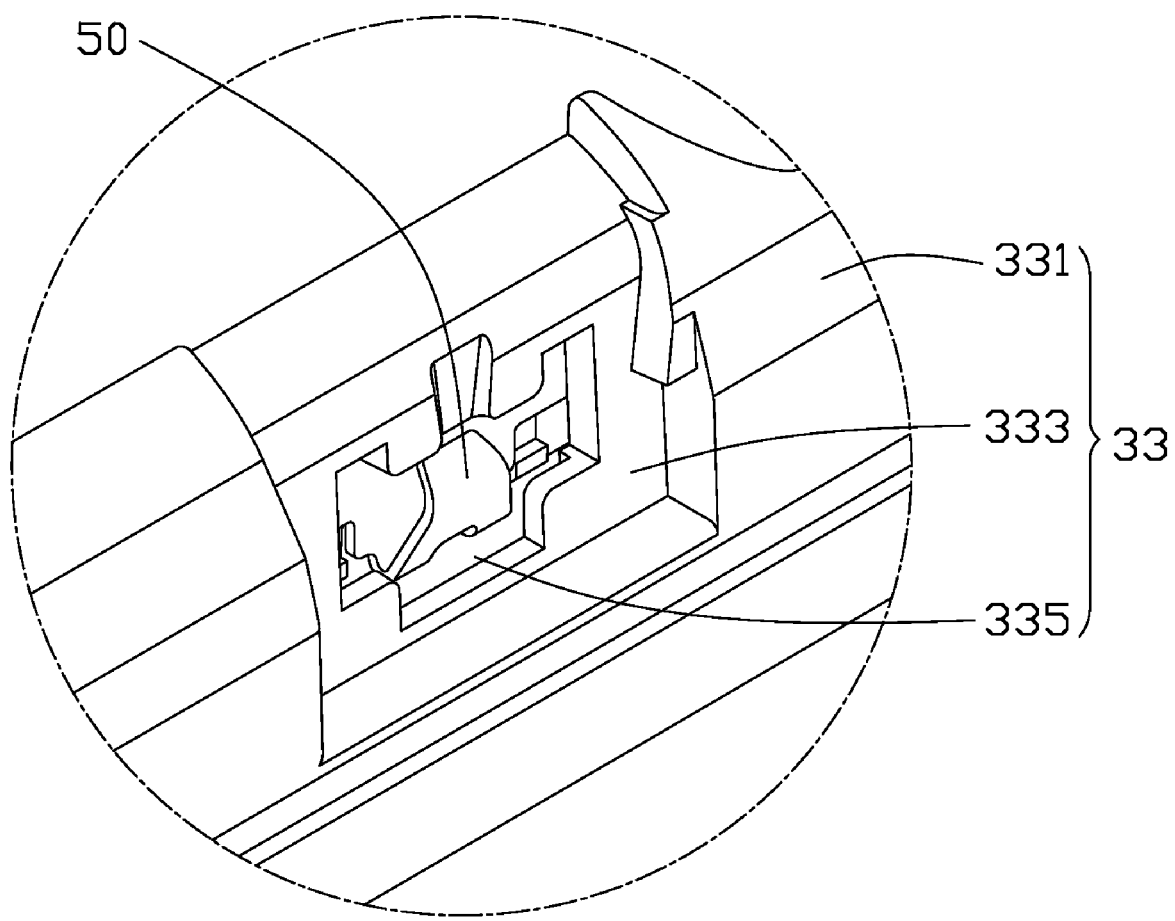
FIG. 5 is an enlarged view of V section in FIG. 1.
Figure 6:
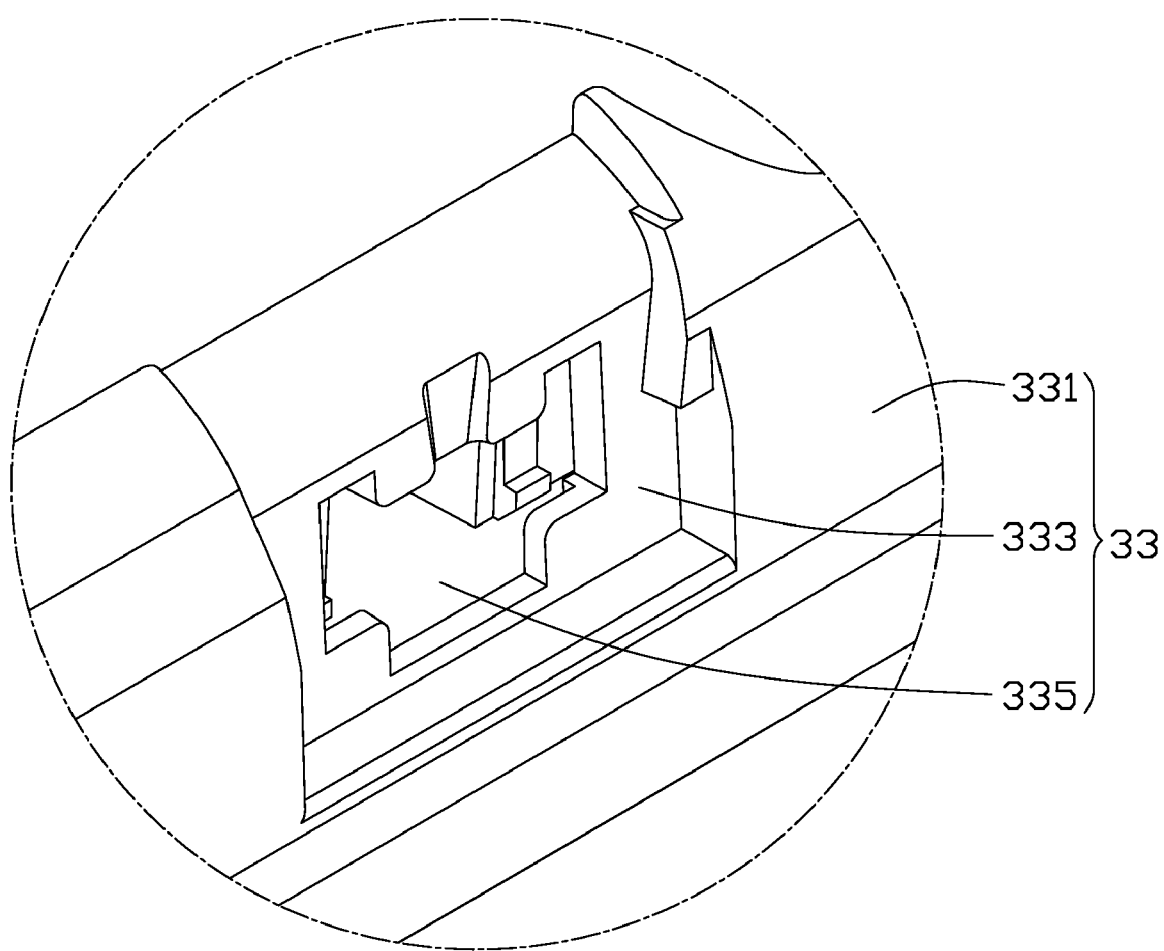
FIG. 6 is an enlarged view of VI section in FIG. 2.
Figure 7:
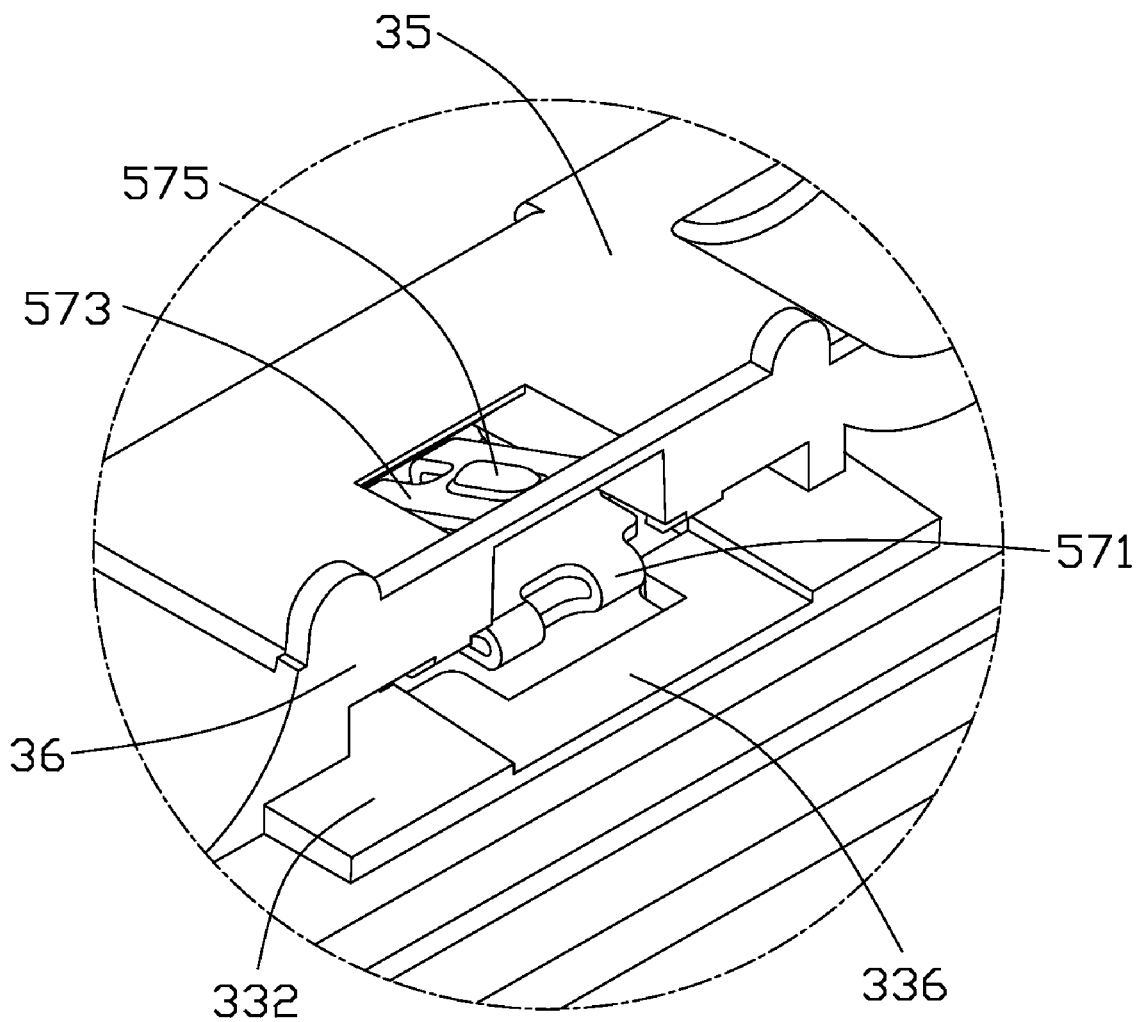
FIG. 7 is an enlarged view of VII section in FIG. 3.
Figure 8:
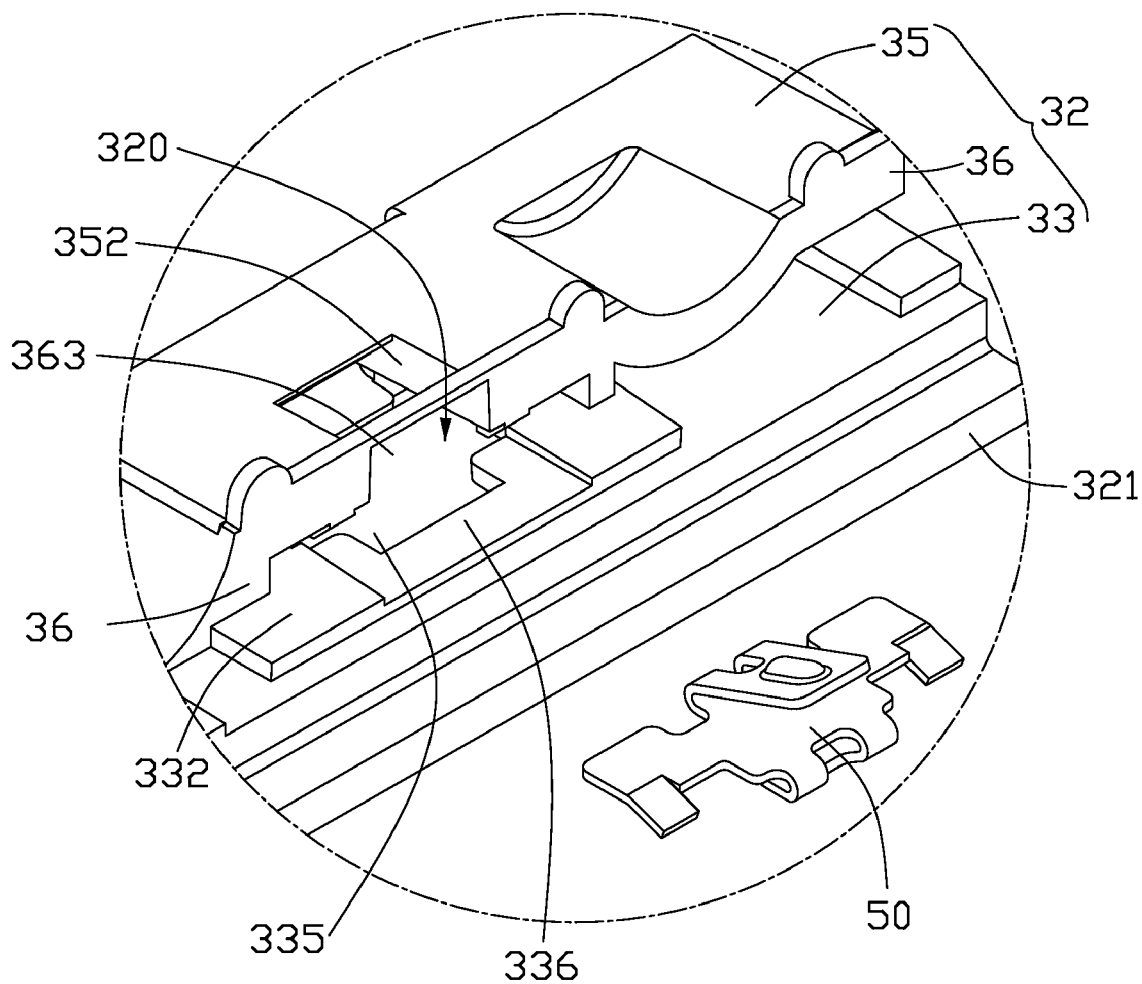
FIG. 8 is an enlarged view of VIII section in FIG. 4.

Referring to FIGS. 4, 6 and 8, the outer portion 33 includes an outer surface 331, an inner surface 332 opposite to the outer surface 331 and a concave assembling groove 333 in the outer surface 331 towards the inner portion 35. The bottom surface of the assembling groove 333 defines a first assembling hole 335. The first assembling hole 335 is irregularly shaped. The inner surface 332 defines a rectangular groove 336. The inner portion 35 defines a rectangular second assembling hole 352. The connecting wall portion 36 defines a through hole 363 communicating with the rectangular groove 336. The outer portion 33, the inner portion 35 and the connecting wall portion 36 partially enclose assembling space 320 to detachably assemble and accommodate the conductive elastic sheet structure 50. The conductive elastic sheet structure 50 can be secured into or detached from the assembling space 320 from the through hole 363.

Figure 9:
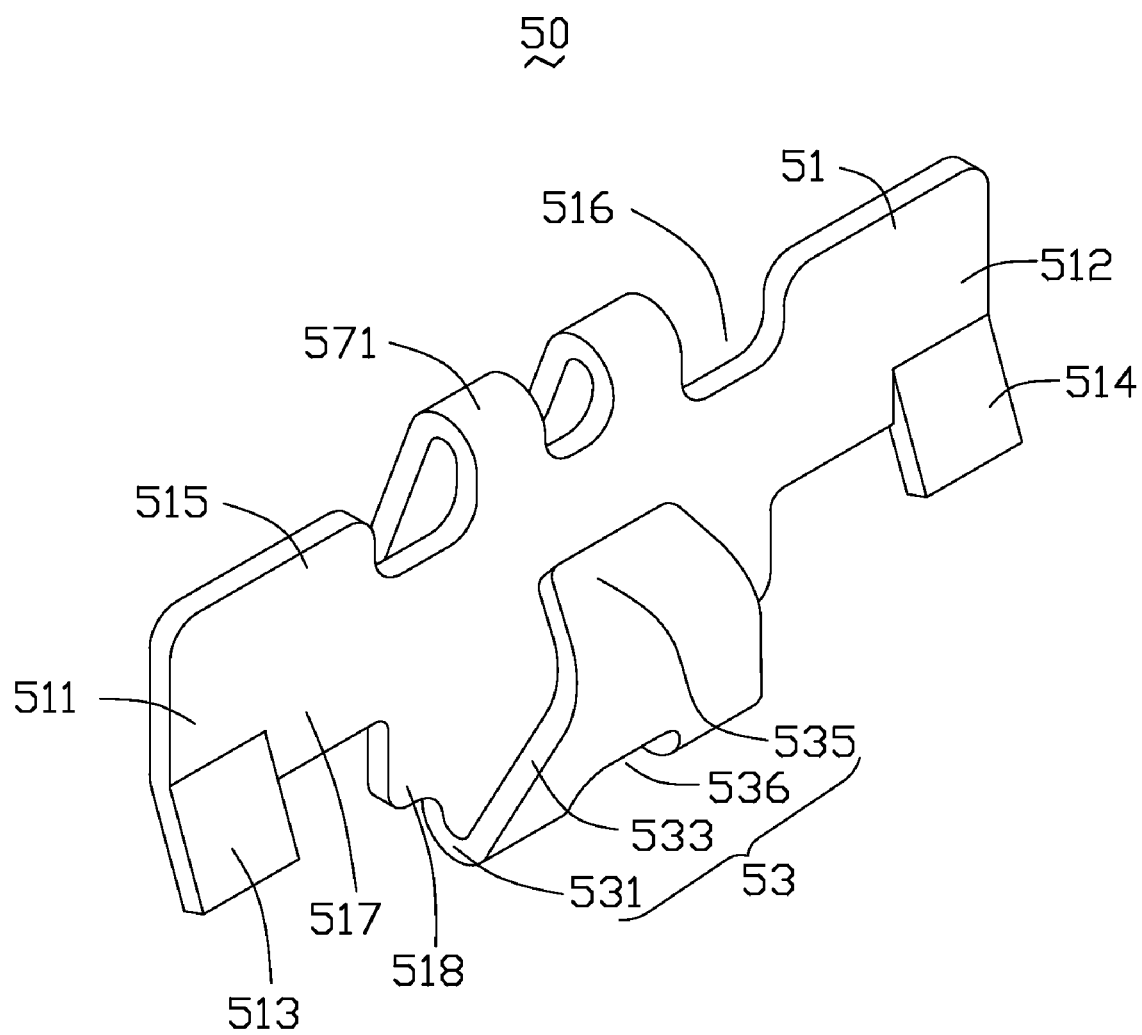
FIG. 9 is an enlarged isometric view of a conductive elastic sheet structure in FIG. 2.
Figure 10:
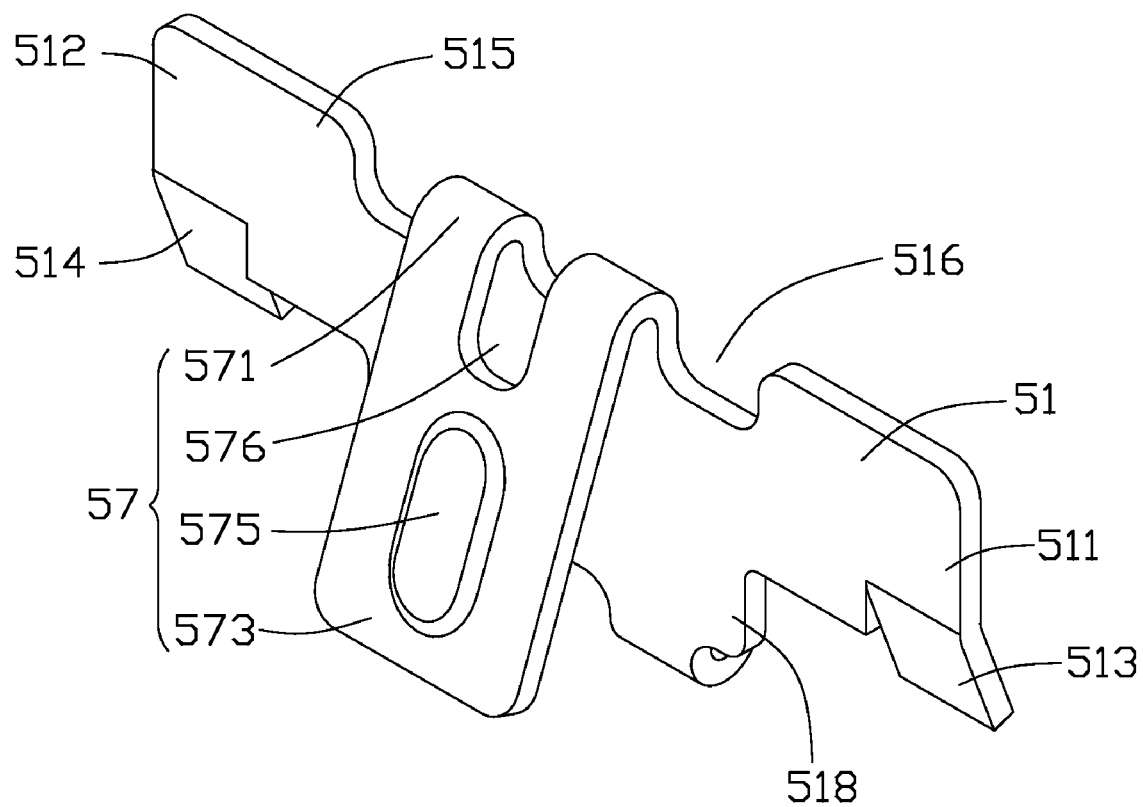
FIG. 10 is similar to FIG. 9 in another aspect.

Referring to FIGS. 3, 9 and 10, the conductive elastic sheet structure 50 is used to eliminate static electricity of the metallic cover 30 and includes a main panel 51, a first extending portion 53 and a second extending portion 57. The main panel 51 is substantially rectangular including a first end portion 511, an opposite second end portion 512, a first side wall 515, and an opposite second side wall 517. The first end portion 511 is bent at an angle on one side of the main panel 51 to form a first bent portion 513. The second end portion 512 is bent at an angle at the same side as the first end portion 511 on the main panel 51 to form a second bent portion 514. An edge of the first side wall 515 defines a generally rectangular notch 516 near the center. The edge of the second side wall 517 has a projection 518 on the middle vertically extending along the main panel 51.

The first extending portion 53 extends downwardly from the distal end of the projection 518 and then bends upwardly, thereby forming a first bottom portion 531 connecting the projection 518, a first elastic body 533 connecting the first bottom portion 531, and a first terminal end 535 connecting the first elastic body 533 towards the main panel 51. The first elastic body 533 is at an acute angel relative to the main panel 51. The joining section of the first bottom portion 531 and the first elastic body 533 defines a through hole 536.

Referring to FIG. 10, the second extending portion 57 is substantially rectangular extending from the main panel 51 out of the notch 516 and opposite to the first extending portion 53. The second extending portion 57 includes a second bottom portion 571 curvedly connecting the main panel 51, and a second elastic body 573 connecting the second bottom portion 571. The second elastic body 573 has an acute angle relative to the main panel 51. The second elastic body 573 has a protrusion 575 protruding away from the main panel 51 to electrically connect with a grounding point within the electronic device 100 for conducting the static electricity through the grounding point. The connecting section of the second bottom portion 571 and the second elastic body 573 defines a through hole 576.

Referring to FIGS. 4 and 7-10, in assembly, the first side wall 515 of the conductive elastic sheet structure 50 is inserted into the assembling space 320 from the through hole 363 of the connecting wall portion 36. The first extending portion 53 faces the inner surface 332 of the outer portion 33 and emerges out of the first assembling hole 335 of the outer portion 33. The second extending portion 57 faces the inner portion 35 and emerge out of the second assembling hole 352 of the inner portion 35. The first bent portion 513 and the second bent portion 514 are elastically deformed and abutted by the inner surface 332 of the outer portion 33.

It is to be understood, however, that even though numerous characteristics and advantages of the present invention have been set forth in the foregoing description, together with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A conductive elastic sheet structure, comprising:
   a main panel comprising a first end portion, a first side wall and an opposite second side wall; the first end portion bent at an angle on one side of the main panel to form a first bent portion;
   a first extending portion extending from the first side wall with an acute angle relative to the main panel; and
   a second extending portion extending from the second side wall at an acute angle with respect to the main panel, the second extending portion and the first extending portion extending from opposite sides of the main panel.

2. The conductive elastic sheet structure as claimed in claim 1, wherein the main panel further comprises a second end portion opposite to the first end portion, the second end portion is bent at an angle on the same side as the first end portion of the main panel to form a second bent portion.

3. The conductive elastic sheet structure as claimed in claim 2, wherein the edge of the first side wall defines a notch in the middle, the edge of the second side wall has a projection on the middle vertically extending along the main board; the first extending portion extends downwardly from the distal end of the projection and then bends upwardly.

4. The conductive elastic sheet structure as claimed in claim 3, wherein the first extending portion includes a first bottom portion connecting the projection, a first elastic body connecting the first bottom portion, and a first terminal end connecting the first elastic body towards the main panel.

5. The conductive elastic sheet structure as claimed in claim 4, wherein the second extending portion includes a second bottom portion curvedly connecting the main panel, and a second elastic body connecting the second bottom portion.

6. The conductive elastic sheet structure as claimed in claim 5, wherein the joining section of the first bottom portion and the first elastic body defines a through hole; the connecting section of the second bottom portion and the second elastic body defines a through hole.

7. The conductive elastic sheet structure as claimed in claim 6, wherein the surface away from the main panel defines a protrusion to electro-connect with a grounding point within the electronic device to discharge the static electricity.

8. An electronic device comprising:
   a metallic cover comprising an upper wall and a side wall connecting two opposite edges of the upper wall; and
   a conductive elastic sheet structure being used to eliminate static electricity from the metallic cover, the conductive elastic sheet structure comprising:
   a main panel comprising a first end portion, a first side wall and an opposite second side wall; the first end portion bent at an angle on one side of the main panel to form a first bent portion;
   a first extending portion extending from the first side wall with an acute angle relative to the main panel; and
   a second extending portion extending from the second side wall at an acute angle with respect to the main panel, the second extending portion and the first extending portion extending from opposite sides of the main panel.

9. The electronic device as claimed in claim 8, wherein the side wall comprising an outer portion with a first assembling hole defined therethrough and an inner portion with a second assembling hole defined therethrough; the first extending portion and the second extending portion emerge out of the first assembling hole and the second assembling hole respectively.

10. The electronic device as claimed in claim 9, wherein the outer portion comprising an outer surface, an inner surface opposite to the outer surface and a concave assembling groove in the outer surface towards the inner portion; the first assembling hole is an irregularly shaped through hole defined through the bottom surface of the assembling groove.

11. The electronic device as claimed in claim 10, wherein the inner surface of the outer portion defines a rectangular groove corresponding to the first assembling hole; the side wall further comprising a connecting wall portion connecting with the outer portion and the inner portion, the connecting wall portion defines a through hole communicating with the rectangular groove; the outer portion, the inner portion and the connecting wall portion partially enclose an assembling space to detachably assemble and accommodate the conductive elastic sheet structure therein.

12. The electronic device as claimed in claim 11, wherein the main panel further comprises an opposite second end portion, the second end portion is bent at an angle on the same side as the first end portion of the main panel to form a second bent portion, the first bent portion and the second bent portion are elastically clasped with the inner surface of the outer portion.

13. The electronic device as claimed in claim 11, wherein the second extending portion includes a second bottom portion curvedly connecting the main panel, and a second elastic body connecting the second bottom portion.

* * * * *